(12) United States Patent
Suzuta et al.

(10) Patent No.: US 8,507,791 B2
(45) Date of Patent: Aug. 13, 2013

(54) SHEET FOR SEALING REAR SURFACE OF SOLAR CELL

(75) Inventors: Masayoshi Suzuta, Tokyo (JP);
Masanobu Yoshinaga, Osaka (JP);
Ikuno Shimeno, Nishinomiya (JP);
Atsushi Tsujii, Ikoma-gun (JP); Bungo Yasui, Tokyo (JP); Seiji Maeda, Hiki-gun (JP)

(73) Assignees: Toppan Printing Co., Ltd., Tokyo (JP);
Toyo Ink Mfg. Co., Ltd., Tokyo (JP)

( * ) Notice: Subject to any disclaimer, the term of this patent is extended or adjusted under 35 U.S.C. 154(b) by 368 days.

(21) Appl. No.: 12/308,572

(22) PCT Filed: Jun. 21, 2007

(86) PCT No.: PCT/JP2007/062501
§ 371 (c)(1),
(2), (4) Date: Dec. 18, 2008

(87) PCT Pub. No.: WO2007/148754
PCT Pub. Date: Dec. 27, 2007

(65) Prior Publication Data
US 2010/0229945 A1    Sep. 16, 2010

(30) Foreign Application Priority Data

Jun. 21, 2006 (JP) ................ P2006-171534

(51) Int. Cl.
*H01L 31/00* (2006.01)
*B32B 27/40* (2006.01)
*B32B 27/38* (2006.01)

(52) U.S. Cl.
USPC .............. 136/259; 428/423.1; 428/414

(58) Field of Classification Search
USPC ............... 428/423.1, 414; 136/259
See application file for complete search history.

(56) References Cited

U.S. PATENT DOCUMENTS

| 4,870,129 A | 9/1989 | Henning et al. |
| 5,593,532 A | 1/1997 | Falk et al. |

(Continued)

FOREIGN PATENT DOCUMENTS

| JP | 58-122977 | 7/1983 |
| JP | 63-006075 | 1/1988 |

(Continued)

OTHER PUBLICATIONS

International Search Report for PCT/JP2007/062501, mailed Oct. 2, 2007.

(Continued)

*Primary Examiner* — Thao T. Tran

(57) ABSTRACT

The present invention provides a sheet for sealing a rear surface of a solar cell in which degradation due to hydrolysis of the material constituting the solar cell is prevented, and the weather resistance is excellent such that electric output properties of the solar cell can be maintained not only under conditions of actual usage of the solar cell module but also conditions for evaluation under high temperatures and high moistures, and provides a sheet for sealing a rear surface of a solar cell comprising a laminate in which at least two substrates are laminated by an polyurethane-based adhesive, wherein the polyurethane-based adhesive comprises an adhesive having hydrolysis resistance which satisfies the following conditions: condition 1: the lamination strength of the adhesive is 1 N/15 mm or more after keeping the laminate in a chamber which acts as a highly accelerated stress test system under pressurized steam conditions of 105° C. and 1.05 atm for 168 hours; and condition 2: the adhesive does not bring on a delamination and a blister between the substrates after keeping the laminate in a chamber which acts as a highly accelerated stress test system under pressurized steam conditions of 105° C. and 1.05 atm for 168 hours.

19 Claims, 2 Drawing Sheets

(56) References Cited

U.S. PATENT DOCUMENTS

| | | | |
|---|---|---|---|
| 6,369,316 B1 | 4/2002 | Plessing et al. | |
| 7,741,425 B2 * | 6/2010 | Burckhardt et al. | 528/44 |

FOREIGN PATENT DOCUMENTS

| | | |
|---|---|---|
| JP | 63-69882 | 3/1988 |
| JP | 04-153253 | 5/1992 |
| JP | 04-342785 | 11/1992 |
| JP | 06-025636 | 2/1994 |
| JP | 8-500214 | 1/1996 |
| JP | 09-157625 | 6/1997 |
| JP | 10-219224 | 8/1998 |
| JP | 11-323299 | 11/1999 |
| JP | 2000-154362 | 6/2000 |
| JP | 2000-164907 | 6/2000 |
| JP | 2000-174296 | 6/2000 |
| JP | 2000-326454 | 11/2000 |
| JP | 2000-332278 | 11/2000 |
| JP | 2000-336139 | 12/2000 |
| JP | 2001-111073 | 4/2001 |
| JP | 2001-152127 | 6/2001 |
| JP | 2001-226445 | 8/2001 |
| JP | 2001-322221 | 11/2001 |
| JP | 2002-003813 | 1/2002 |
| JP | 2002-26343 | 1/2002 |
| JP | 2002-26354 | 1/2002 |
| JP | 2002-083978 | 3/2002 |
| JP | 2002-100788 | 4/2002 |
| JP | 2002-134771 | 5/2002 |
| JP | 2002-194319 | 7/2002 |
| JP | 2002-520820 | 7/2002 |
| JP | 3361244 | 1/2003 |
| JP | 2003-137961 | 5/2003 |
| JP | 2003-155321 | 5/2003 |
| JP | 2003-205589 | 7/2003 |
| JP | 2004-043519 | 2/2004 |
| JP | 3532787 | 5/2004 |
| JP | 2004-160782 | 6/2004 |
| JP | 2004-200322 | 7/2004 |
| JP | 2004-231864 | 8/2004 |
| JP | 2004-247390 | 9/2004 |
| JP | 3583629 | 11/2004 |
| JP | 2004-352966 | 12/2004 |
| JP | 3606680 | 1/2005 |
| JP | 2005-101404 | 4/2005 |
| JP | 2005-119064 | 5/2005 |
| JP | 2005322681 A * | 11/2005 |
| JP | 2005-336709 | 12/2005 |
| JP | 2006-73793 | 3/2006 |
| JP | 3768411 | 4/2006 |
| JP | 2006-120972 | 5/2006 |
| JP | 2006-179557 | 7/2006 |
| JP | 2006253264 A * | 9/2006 |
| JP | 3829526 | 10/2006 |
| JP | 2006332091 A * | 12/2006 |
| JP | 2007-320218 | 12/2007 |

OTHER PUBLICATIONS

Keiji, Iwata, "Handbook for Polyurethane Resin," First Edition, First Print: Sep. 25, 1987, 4 pages (including partial translation from p. 126).

Japanese Office Action for corresponding Japanese Patent Application No. 2006-171534, mailed on Jul. 24, 2009.

Japanese Office Action for corresponding Japanese Patent Application No. 2006-171534, mailed on Mar. 14, 2011.

Japanese Office Action for corresponding Japanese Patent Application No. 2006-171534, mailed on Mar. 24, 2011.

Japanese Office Action in corresponding Japanese patent Application No. 2006-171534 issued Oct. 3, 2012.

Japanese Office Action issued Jun. 26, 2012 in corresponding Japanese Patent Application No. 2006-171534.

Japanese Office Action issued Jan. 8, 2013 for corresponding Japanese Application No. 2006-171534.

Reference Document of National Institute of Technology and Evaluation for CSCL No. "7-1283", 3 pages, cited in Japanese Notification (Information Statement) issued Oct. 5, 2011 for corresponding Japanese Application No. 2006-171534.

Material Safety Data Sheet for TAKELAC A511 (abstract), Oct. 22, 2008, 4 pages.

Japanese Notification (Information Statement) issued Oct. 5, 2011 for corresponding Japanese Application No. 2006-171534.

Japanese Office Action mailed May 21, 2013 in corresponding Japanese Patent Application No. 2006-171534.

* cited by examiner

SHEET FOR SEALING REAR SURFACE OF SOLAR CELL

CROSS REFERENCE TO RELATED APPLICATIONS

This application claims the benefit under 35 U.S.C. Section 371, of PCT International Application Number PCT/JP2007/062501, filed Jun. 21, 2007 and Japanese Application No. 2006-171534 filed Jun. 21, 2006 in Japan, the contents of which are incorporated herein by reference.

TECHNICAL FIELD

The present invention relates to a sheet for sealing a rear surface of a solar cell which has excellent hydrolysis resistance. More particularly, the present invention relates to a sheet for sealing a rear surface of a solar cell which is made by lamination using an adhesive having especially excellent hydrolysis resistance, and can not only prevent degradation due to hydrolysis, and an appearance defect due to delamination, but also maintain barrier characteristic as a sheet for sealing a rear surface of a solar cell.

Priority is claimed on Japanese Patent Application No. 2006-171534, filed Jun. 21, 2006, the content of which is incorporated herein by reference.

BACKGROUND ART

In recent years, with the increasing concerning in a global warming in various quarters in Japan and abroad, various efforts have continued for discharge control of carbon dioxide. An increase in the consumption of fossil fuels brings an increase of carbon dioxide released into the atmosphere. Due to the greenhouse effect, the atmospheric temperature of the earth rises, and it makes a serious influence to the environments of the earth. In order to solve the global problems, various approaches have been examined. In particular, anticipation for photovoltaic generation is increasing, because it is clean and does not generate environmental pollution.

The solar cell constitutes a core part of the solar energy power generation system which directly changes the energy of sunlight into the electrical energy, and which is made of a semiconductor of a single crystal, polycrystal, amorphous silicon, etc. A solar cell element (cell) is not used alone. In general, several to several dozen of the solar battery elements are wired in series or in parallel, and the solar battery elements are packed to be unitized in order to protect the cell over a long period of time (about 20 years). The unit built in the package is called a solar cell module.

As shown in FIG. 1, the solar cell module includes a surface exposed to the sunlight which is covered with a glass A-3, gaps separating the solar cell elements A-1 are filled with a thermoplastic A-2, in particular, a filler including an ethylene-vinyl acetate copolymer, and the rear surface thereof is protected by a sealing sheet B.

Since the solar cell modules are used out doors, the structure, material to be used, etc. are required to have sufficient durability and weather resistance. In particular, the sheet for sealing a rear surface of a solar cell is required to have weather resistance as well as a small moisture vapor transmission rate (that is, excellent moisture barrier properties). When a filler is peeled, or discolored, or wiring is corroded, by moisture transmission, there is possibility that electrical output power itself of the module is influenced.

In the past, a fluorine resin which has excellent adhesive to an ethylene-vinyl acetate copolymer which has excellent weather resistance and fire resistance and has been used as a filler for the solar cell module (Patent Document Nos. 1 and 2). In addition, a sheet for sealing a rear surface of a solar cell which includes a film made of polyester having excellent electric insulation, such as polyethylene terephtharate, has also been developed. Furthermore, in order to improve inferior weather resistance, which is a disadvantage of the polyester film, a composition comprising an ultraviolet absorber was suggested (Patent Document No. 3), attempts in which an amount of a circular oligomer in polyester is adjusted (Patent Document Nos. 4 and 5), and in which the molecular weight of polyester is adjusted (Patent Document No. 6), were suggested.

As explained above, the solar cell is required to maintain its performance for about twenty years. In order to evaluate the durability, an acceleration test was performed under a high temperature and a high moisture (85° C.-85% relative humidity) environment. In particular, when a polyester film is used as a substrate, the film substrate is hydrolyzed in the acceleration test, and the strength of the film is dramatically decreased. Therefore, as explained in Patent Documents, it is very much a situation in which various attempts were made to compensate the decrease of the strength. However, there is a new problem that is caused by improving the weather resistance (hydrolysis resistance) of the film substrate.

The problem is delamination which is caused by hydrolysis of an adhesive for attaching the film substrate. In general, when heat resistance and safety are concerned, a polyurethane-based adhesive comprising polyester polyol as a main component is used. However, polyester polyol is hydrolyzed and the molecular weight thereof becomes smaller. Thereby, a problem, in which adhesive strength is remarkably decreased under the conditions of the acceleration test, is highlighted.

The problem is similarly happened in the fluorine resin which is explained above. When the acceleration test was conducted, not only is the surface raised by delamination with time and the appearance inferior, but the barrier properties which are required for the sheet for sealing a rear surface are also decreased. These may affect the electric output of the solar cell.

It is very much a situation in which not only is the film substrate required to have weather resistance (hydrolysis resistance) but also the adhesive for attaching the film substrates is required to have hydrolysis resistance. However, these requirements have not been achieved yet.

[Patent Document No. 1]: Japanese Language publication (Kohyo) 8-500214 corresponding to PCT Application

[Patent Document No. 2]: Japanese Language publication 2002-520820 corresponding to PCT Application

[Patent Document No. 3]: Japanese Patent Application, First Publication No. 2001-111073

[Patent Document No. 4]: Japanese Patent Application, First Publication No. 2002-100788

[Patent Document No. 5]: Japanese Patent Application, First Publication No. 2002-134771

[Patent Document No. 6]: Japanese Patent Application, First Publication No. 2002-26354

DISCLOSURE OF INVENTION

Problems to be Solved by the Present Invention

The present invention was made in consideration of the technological background. An object of the present invention is to provide a sheet for sealing a rear surface of a solar cell in which not only degradation of the material constituting the solar cell due to hydrolysis and appearance defects due to delamination are prevented, but also the weather resistance is excellent such that the electric output properties of the solar cell can be maintained, under high temperatures and high humid conditions which are evaluation conditions for the solar cell.

In addition, another object of the present invention is to provide a sheet for sealing a rear surface of a solar cell including a gas barrier layer which can maintain the gas barrier properties of the gas barrier layer.

Furthermore, another object of the present invention is to provide a solar cell module which can maintain excellent electric output properties for a long period of time.

Means for Solving the Problem

In order to achieve the objects, the present invention provides a sheet for sealing a rear surface of a solar cell including a laminate in which at least two substrates are attached by an polyurethane-based adhesive, wherein the polyurethane-based adhesive includes an adhesive having hydrolysis resistance which satisfies the following conditions:

condition 1: the lamination strength of the adhesive is 1 N/15 mm or more after keeping the laminate in a chamber which acts as a highly accelerated stress test system under pressurized steam conditions of 105° C. and 1.05 atm for 168 hours; and condition 2: the adhesive does not raise a surface of the substrates after keeping the laminate in a chamber which acts as a highly accelerated stress test system under pressurized steam conditions of 105° C. and 1.05 atm for 168 hours.

In the sheet for sealing a rear surface of a solar cell, it is preferable that the polyurethane-based adhesive be an adhesive composition including 1 to 50 parts by weight of at least one compound selected from the group consisting of a carbodiimide compound, an oxazoline compound, and an epoxy compound, relative to 100 parts by weight of a composition including polyol A and a crosslinking agent, and the polyol A be at least one of polyester polyol and polyester urethane polyol of which a chain is elongated by an isocyanate compound having two or greater functional groups.

In the sheet for sealing a rear surface of a solar cell, it is preferable that the polyurethane-based adhesive be an adhesive composition including polyol B and a crosslinking agent, and the polyol B be at least one of polycarbonate polyol and polycarbonate urethane polyol of which a chain is elongated by an isocyanate compound having two or greater functional groups.

In the sheet for sealing a rear surface of a solar cell, it is preferable that the polyurethane-based adhesive be an adhesive composition including 1 to 50 parts by weight of at least one compound selected from the group consisting of a carbodiimide compound, an oxazoline compound, and an epoxy compound, relative to 100 parts by weight of the polyol B and a crosslinking agent.

In the sheet for sealing a rear surface of a solar cell, it is preferable that the polyurethane-based adhesive be an adhesive composition including polyol C and a crosslinking agent, and the polyol C be acrylpolyol in which a hydroxyl group is introduced into a side chain.

In the sheet for sealing a rear surface of a solar cell, the polyurethane-based adhesive be an adhesive composition including 1 to 50 parts by weight of at least one compound selected from the group consisting of a carbodiimide compound, an oxazoline compound, and an epoxy compound, relative to 100 parts by weight of the polyol C and a crosslinking agent.

In the sheet for sealing a rear surface of a solar cell, it is preferable that the polyurethane-based adhesive be an adhesive composition including polyol D and a crosslinking agent, and the polyol D include 1 to 50% by weight of the polyol A, and 50 to 99% by weight of at least one of the polyol B and the polyol C.

In the sheet for sealing a rear surface of a solar cell, it is preferable that the polyurethane-based adhesive be an adhesive composition including 1 to 50 parts by weight of at least one compound selected from the group consisting of a carbodiimide compound, an oxazoline compound, and an epoxy compound, relative to 100 parts by weight of polyol D and a crosslinking agent, and the polyol D include 1 to 50% by weight of the polyol A, and 50 to 99% by weight of at least one of the polyol B and the polyol C.

In the sheet for sealing a rear surface of a solar cell, it is preferable that the polyurethane-based adhesive be an adhesive composition including polyol E and a crosslinking agent, and the polyol E be a polyol copolymer in which 1 to 50% by weight of the polyol A, and 50 to 99% by weight of at least one of the polyol B and the polyol C be subjected to a chain elongation reaction with an isocyanate compound having two or more functional groups.

In the sheet for sealing a rear surface of a solar cell, it is preferable that the polyurethane-based adhesive be an adhesive composition including 1 to 50 parts by weight of at least one compound selected from the group consisting of a carbodiimide compound, an oxazoline compound, and an epoxy compound, relative to 100 parts by weight of polyol E and a crosslinking agent, and the polyol E be a polyol copolymer in which 1 to 50% by weight of the polyol A, and 50 to 99% by weight of at least one of the polyol B and the polyol C be subjected to a chain elongation reaction with an isocyanate compound having two or more functional groups.

In the sheet for sealing a rear surface of a solar cell, it is preferable that the polyurethane-based adhesive be an adhesive composition including 1 to 50 parts by weight of at least one compound selected from the group consisting of a carbodiimide compound, an oxazoline compound, and an epoxy compound, relative to 100 parts by weight of polyol F and a crosslinking agent, and the polyol F be at least one of polyether polyol and polyether urethane polyol of which a chain is elongated by an isocyanate compound having two or greater functional groups.

In the sheet for sealing a rear surface of a solar cell, examples of the crosslinking agent include at least one isocyanate compound selected from the group consisting of 2,4-tolylene diisocyanate, 2,6-tolylene diisocyanate, xylene diisocyanate, 4,4'-diphenylmethane diisocyanate, methylene diisocyanate, isopropylene diisocyanate, lysine diisocyanate, 2,2,4-trimethylhexamethylene diisocyanate, 2,4,4-trimethylhexamethylene diisocyanate, 1,6-hexamethylene diisocyanate, methylcyclohexane diisocyanate, isophorone diisocyanate, 4,4'-dicyclohexylmethane diisocyanate, and isopropylidene cyclohexyl-4,4'-diisocyanate; an adduct, a buret, and an isocyanurate which includes at least one of the isocyanate compounds.

In the sheet for sealing a rear surface of a solar cell, it is preferable that the substrate be a substrate made of polyester selected from the group consisting of polyethylene terephthalate (PET), polyethylene naphthalate (PEN), polybutylene terephthalate (PBT), and polycyclohexane dimethanol-terephthalate (PCT); a substrate made of polycarbonate; a substrate made of a fluorine-containing material selected from the group consisting of polyvinyl fluoride (PVF), poly vinylidene fluoride (PVDF), polychlorotrifluoroethylene resin (PCTFE), polyethylene tetrafluoroethylene (ETFE), polytetrafluoroethylene (PTFE), a tetrafluoroethylene perfluoroalkyl vinyl ether copolymer (PFA), and a tetrafluoroethylene-hexafluoropropylene copolymer (FEP); and a substrate made of acylic resin.

In the sheet for sealing a rear surface of a solar cell, it is also preferable that the substrate be a substrate made of polyester in which an number average molecular weight is in a range from 18,000 to 40,000, an content of a cyclic oligomer is 1.5% by weight or less, an inherent viscosity is 0.5 dl/g or greater, and which has hydrolysis resistance.

In the sheet for sealing a rear surface of a solar cell, it is further preferable that the laminate include an aluminum foil substrate, an aluminum evaporated substrate, a silica evaporated substrate, or an alumina evaporated substrate.

In addition, in order to achieve the object, the present invention provides a solar cell module including the sheet for sealing a rear surface of a solar cell.

EFFECT OF THE PRESENT INVENTION

The sheet for sealing a rear surface of a solar cell according to the present invention includes the laminate which is made using the adhesive having especially excellent hydrolysis resistance. Therefore, it is possible to prevent degradation due to hydrolysis of the material constituting the solar cell and appearance defects due to delamination not only under conditions for actual usage of the solar cell module but also in conditions for evaluation under high temperatures and high humid conditions, in addition to maintain excellent barrier properties and electric output properties.

The solar cell module according to the present invention can maintain excellent electric output properties.

Figure 1:
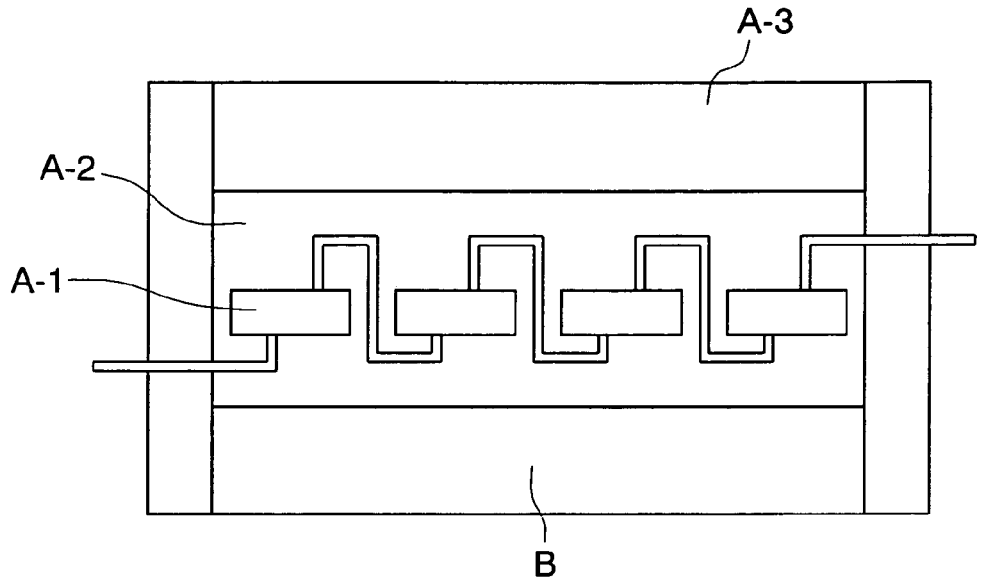
FIG. 1 is a view showing one example of the solar cell module.

| EXPLANATION OF REFERENCE SYMBOLS | |
|---|---|
| A: | solar cell module |
| A-1: | solar cell |
| A-2: | filler |
| A-3: | glass plate |
| B: | sheet for sealing a rear surface of a solar cell |
| B-1: | substrate |
| B-2: | polyurethane-based adhesive |
| B-3: | barrier layer |
| C: | laminator |
| C-1: | top board |
| C-2: | chamber 1 |
| C-3: | chamber 2 |
| C-4: | rubber sheet |

BEST MODE FOR CARRYING OUT THE INVENTION

Hereafter, preferable embodiments of the present invention are explained in detail.

One feature of the sheet for sealing a rear surface of a solar cell is that a polyurethane-based adhesive used to attach two or greater of a sheet for sealing a rear surface of a solar cell is an adhesive or an adhesive composition which has excellent hydrolysis resistance.

Hydrolysis resistance is a barometer of influences due to hydrolysis in an adhesive. In the present invention, excellent hydrolysis resistance means that it has a lamination strength of 1 N/15 mm or more and it does not make a surface of the substrates raise after an acceleration evaluation (IEC-60068-2-66 (MS 60068-2-66)) under pressurized steam conditions (105° C. and 1.05 atm for 168 hours).

That is, hydrolysis resistance is a barometer of influences due to hydrolysis in an adhesive. An adhesive or an adhesive composition having excellent hydrolysis resistance means that it has lamination strength of 1 N/15 mm or more and it does bring on a delamination and a blister between the substrates after an acceleration evaluation (an acceleration evaluation under pressurized steam conditions) using a HAST chamber, specifically, after keeping it at 105° C. and 1.05 atm for 168 hours in accordance with a method disclosed in IEC-60068-2-66.

An adhesives or an adhesive composition which has excellent hydrolysis resistance used in the present invention is explained below.

First, examples of a polyurethane-based adhesive used in the sheet for sealing a rear surface of a solar cell include an adhesive composition including 1 to 50 parts by weight of at least one compound selected from the group consisting of a carbodiimide compound, an oxazoline compound, and an epoxy compound, relative to 100 parts by weight of polyol A and a crosslinking agent.

As explained above, the polyol A is at least one of polyester polyol and polyester urethane polyol of which a chain is elongated by an isocyanate compound having two or greater functional groups.

The polyol A contained in the adhesive composition has excellent initial lamination strength between substrates, and heat resistance which can sufficiently stand for an acceleration test under high temperatures.

In addition, the polyol A has an urethane bond having excellent hydrolysis resistance. However, it also has an ester bond having hydrolysable properties.

An ester bond portion which is hydrolyzed under acceleration evaluation conditions at high temperatures and high humidity decomposes into a carboxyl group and a hydroxyl group. The carboxyl group functions as an acid catalyst, and promotes hydrolysis in other ester bond portions.

Therefore, in order to block the carboxyl group generated by the hydrolysis, 1 to 50 parts by weight of at least one compound selected from the group consisting of a carbodiimide compound, an oxazoline compound, and an epoxy compound, relative to 100 parts by weight of the polyol A and a crosslinking agent, is added.

Examples of the polyester polyol used in the present invention include aliphatic dicarboxylic acids such as succinic acid, glutaric acid, adipic acid, pimelic acid, speric acid, azelaic acid, sebacic acid and a brasylic acid; aromatic dicarboxylic acids such as isophthalic acid, terephthalic acid, naphthalene dicarboxylic acid; aliphatic diols such as ethylene glycol, propylene glycol, butanediol, neopentyl glycol, methyl pentanediol, hexanediol, heptanediol, octanediol, nonanediol, decanediol, and dodecanediol; alicyclic diols such as cyclohexanediol and hydrogenated xylylene glycol; and aromatic diols such as xylylene glycol. These can be used alone or in combination.

Examples of the polyester urethane polyol of which a chain is elongated with an isocyanate compound having two or greater functional groups include polyester polyurethane diols in which both the hydroxyl groups at the ends of the polyester polyol are elongated with an isocyanate selected from 2,4-tolylene diisocyanate, 2,6-tolylene diisocyanate, xylylene diisocyanate, 4,4'-diphenylmethane diisocyanate, methylene diisocyanate, isopropylene diisocyanate, lysine diisocyanate, 2,2,4-trimethylhexamethylene diisocyanate, 2,4,4-trimethylhexamethylene diisocyanate, 1,6-hexamethylene diisocyanate, methylcyclohexane diisocyanate, isophorone diisocyanate, 4,4'-dicyclohexylmethane diisocyanate, and isopropylidene dicyclohexyl-4,4'-diisocyanate, and adducts, burets, or isocyanurates thereof.

Examples of the crosslinking agent for the polyol A include the isocyanate compounds. However, the crosslinking agent is not limited to the isocyanate compounds, and examples of the crosslinking agent include any crosslinking agents having reactivity to a group containing an active hydrogen.

Examples of the carbodiimide compound which is added to block the carboxyl group generated in hydrolysis of the polyol A under acceleration evaluation conditions at high temperatures and high humidity include N,N'-di-o-toluoyl carbodiimide, N,N'-diphenyl carbodiimide, N,N'-di-2,6-dimethylphenyl carbodiimide, N,N'-bis(2,6-diisopropylphenyl) carbodiimide, N,N'-dioctyldecyl carbodiimide, N-triyl-N'-cyclohexyl carbodiimide, N,N'-di-2,2-di-tert-buthylphenyl carbodiimide, N-triyl-N'-phenyl carbodiimide, N,N'-di-p-nitrophenyl carbodiimide, N,N'-di-p-aminophenyl carbodiimide, N,N'-di-p-hydroxyphenyl carbodiimide, N,N'-di-cyclohexyl carbodiimide, and N,N'-di-p-toluoyl carbodiimide.

In addition, examples of the oxazoline which functions similarly to the carbodiimide compounds include monooxazolines such as 2-oxazoline, 2-methyl-2-oxazoline, 2-phenyl-2-oxazoline, 2,5-dimethyl-2-oxazoline, and 2,4-diphenyl-2-oxazoline, and dioxazolines such as 2,2'-(1,3-phenylene)-bis(2-oxazoline), 2,2'-(1,2-ethylene)-bis(2-oxazoline), 2,2'-(1,4-butylene)-bis(2-oxazoline), 2,2'-(1,4-phenylene)-bis(2-oxazoline).

Examples of the epoxy compound which functions similarly to the carbodiimide compounds include diglycidyl ethers of aliphatic diols such as 1,6-hexanediol, neopentyl glycol, and polyalkylene glycol; polyglycidyl ethers of aliphatic polyols such as sorbitol, sorbitan, polyglycerol, pentaerythritol, diglycerol, glycerol, and trimethylol propane; polyglycidyl ethers of alicyclic polyols such as cyclohexane dimethanol; diglycidyl esters or polyglycidyl esters of aliphatic polycarboxylic acids or aromatic polycarboxylic acids such as terephthalic acid, isophthalic acid, naphthalene dicarboxylic acid, trimellitic acid, adipic acid, and sebacic acid; diglycidyl esters or polyglycidyl ethers of polyphenols such as resorcinol, bis-(p-hydroxyphenyl)methane, 2,2-bis-(p-hydroxyphenyl)propane, tris-(p-hydroxyphenyl)methane, and 1,1,2,2-tetrakis (p-hydroxyphenyl)ethane; N-glycidyl derivatives of amines such as N,N-diglycidyl aniline, N,N-diglycidyl toluidine, and N,N,N',N'-tetraglycidyl-bis-(p-aminophenyl)methane; triglycidyl derivatives of amino phenol; triglycidyl tris(2-hydroxyethyl)isocyanurate, triglycidyl isocyanurate, orthocresol type epoxy resin, and phenol novolac type epoxy resin.

1 to 50 parts by weight of the compound which can block a carboxyl group is added to 100 parts by weight of the composition including the polyol A and the crosslinking agent. When the amount is less than 1 part by weight, hydrolysis resistance is inferior. Adding a large amount of the compound is preferable for blocking the carboxyl group generated in hydrolysis. However, an amount of polyurethane component contributing adhesive properties may be smaller, and adhesive functions may be deteriorated. In addition, when handling properties for coating the polyurethane-based adhesive are concerned, the amount added is preferably 50 parts by weight or less.

In addition, compounds which conduct a crosslinking reaction with the hydroxyl group generated by hydrolysis as the starting point may be added.

Examples of the compounds include phosphorus compounds such as tris(2,4-di-t-buthylphenyl)phosphite, tetrakis (2,4-di-t-buthylphenyl)-4,4'-biphenylene phosphonite, bis(2,4-di-t-butylphenyl)pentaerythritol-di-phosphite, bis(2,6-di-t-butyl-4-methylphenyl)pentaerythritol-di-phosphite, 2,2-methylene bis(4,6-di-t-butylphenyl)octyl phosphite, 4,4'-butylidene-bis(3-methyl-6-t-butylphenyl-di-tridecyl) phosphite, 1,1,3-tris(2-methyl-4-ditridecyl phosphate-5-t-butyl-phenyl)butane, tris(mixed monononylphenyl and dinonylphenyl)phosphite, tris (nonylphenyl)phosphite, 4,4'-isopropylidenesbis(phenyl-dialkyl phosphite).

However, in order to prevent hydrolysis of the polyester compounds, it is essential to block the carboxyl group which functions as an acidic catalyst in hydrolysis rather than to crosslink the hydroxyl group generated by hydrolysis with the phosphorus compound. Therefore, the carbodiimide compounds, oxazoline compounds, and epoxy compounds are preferable. Among these, the carbodiimide compounds are more preferable.

In the polyurethane-based adhesive including the polyol A, hydrolysis is prevented by the carbodiimide compound, oxazoline compound, and/or the epoxy compound. In contrast, it is also possible to prevent hydrolysis in the polyurethane-based adhesive itself.

In this case, examples of polyol components which can be used as a raw material for polyurethane include the polyol B, polyol C, and polyol F. In addition, it is also possible to use a compound made by using the polyol as a main component.

Moreover, the polyol B is at least one of polycarbonate polyol and polycarbonate urethane polyol of which a chain is elongated by an isocyanate compound having two or greater functional groups, as explained above.

The polyol C is acryl polyol in which a hydroxyl group is introduced into a side chain.

The polyol F is at least one of polyether polyol and polyether urethane polyol of which a chain is elongated by an isocyanate compound having two or greater functional groups.

Among the polyol B, polyol C, and polyol F, the polyol B and the polyol C are preferable from the view point of heat resistance.

The polycarbonate polyol which can be used as the polyol B can be produced by reacting a carbonate compound with diol.

Examples of the carbonate compound include dimethyl carbonate, diphenyl carbonate, and ethylene carbonate.

Examples of the diol include aliphatic diols such as ethylene glycol, propylene glycol, butanediol, neopentyl glycol, methyl pentanediol, hexandiol, heptane diol, octanediol, nonanediol, deccandiol, and dodecanediol; alicyclic diols such as cyclohexanediol, and hydrogenated xylylene glyl; and aromatic diol such as xylylene glyl. These diols can be used alone or in combination.

In addition, polycarbonate urethane polyol, which is obtained by elongating a chain of the polycarbonate polyol obtained by reacting the carbonate compound with the diol compound with an isocyanate compound having two or greater functional groups, can be used as the polyol B, as explained above.

Among these, aliphatic polycarbonate polyol is preferable from the view point of performance as an adhesive.

Acryl polyol, in which a hydroxyl group is introduced into a side chain, used as the polyol C may be a polymer obtained by a monomer containing a hydroxyl group such as 2-hydroxyethyl (meta)acrylate, 2-hydroxypropyl (meta)acrylate, and (meth)acrylic acid and/or alkyl (meth)acrylate monomer (the alkyl group may be a methyl group, ethyl group, n-propyl group, i-propyl group, n-butyl group, i-butyl group, t-butyl group, 2-ethylhexyl group, and cyclohexyl group).

In addition, a copolymer which is obtained by copolymerizing a monomer having an amide group such as (meth)acryl amide, N-alkyl (meta)acrylamide, N,N-dialkyl(meth)acrylamide (the alkyl group may be a methyl group, ethyl group, n-propyl group, i-propyl group, n-butyl group, i-butyl group, t-butyl group, 2-ethylhexyl group, cyclohexyl group, etc.), N-alkoxy (meta)acrylamide, N,N-dialkoxy (meta)acrylamide (the alkoxyl group may be a methoxy group, ethoxy group, butoxy group, isobutoxy group, etc.), N-methylol (meth)acrylamide, N-phenyl (meta)acrylamide; and a monoer having a glycidyl group such as glycidyl (meta)acrylate and allyl glycidyl ether, etc, can also be used.

Furthermore, it is also possible to use a copolymer which is obtained by copolymerizing a monomer such as vinyl isocyanate, allyl isocyanate, styrene, α-methylstyrene, vinylmethyl ether, vinylethyl ether, maleic acid, alkyl maleic acid monoester, fumaric acid, alkyl fumaric acid monoester, itaconic acid, alkyl itaconic acid monoester, (meth)acrylonitrile, vinylidene chloride, ethylene, propylene, vinyl chloride, vinyl acetate, butadiene, etc.

The polyol B and polyol C can also be used together with the polyol A. Specifically, a composition containing the polyol A and the polyol B, a composition containing the polyol A and the polyol C, or a composition containing the polyol A, the polyol B, and the polyol C, can also be used. In other words, the polyurethane-based adhesive in the present invention may be the polyol D.

The content of the polyol B and/or the polyol C with a skeleton having hydrolysis resistance in the polyol D is in a range from 50 to 99% by weight, and the content of the polyol A with a skeleton having hydrolyzability in the polyol D is in a range from 1 to 50% by weight.

In addition, the polyurethane-based adhesive in the present invention may be a copolymer which is obtained by a chain elongation reaction of the polyol A and at least one of the polyol B and the polyol C with the isocyanate compound having two or more functional groups. That is, the polyurethane-based adhesive in the present invention may be the polyol E.

The polyol E has many kinds of structure. For example, the polyol E may be a block copolymer having a main chain of the polyol B-the polyol A, or a block copolymer having a side chain of the polyol C-the polyol A.

The content of the polyol B and/or the polyol C having a skeleton which has hydrolysis resistance in the polyol E is in a range from 50 to 99% by weight, and the content of the polyol A having a skeleton which has hydrolyzability in the polyol E is in a range from 1 to 50% by weight.

In other words, the polyurethane-based adhesive is a copolymer combining the polyol A having hydrolyzability and the polyol B and/or the polyol C having hydrolysis resistance, or a mixture containing the copolymer.

At least one compound of the carbodiimide compound, oxazoline compound, and epoxy compound, and preferably the carbodiimide compound may be added to the polyols B to E.

However, the compound which blocks a carboxyl group is not an essential component. Therefore, the amount of the compound may be in a range from about 1 to about 50 parts by weight to 100 parts by weight of the compound containing the polyols B to E and the crosslinking agent.

The polyurethane-based adhesive is used to attach substrates in the sheet for sealing a rear surface of a solar cell. Examples of a preferable substrate include substrates made of polyester such as polyethylene terephthalate (PET), polyethylenenaphthalate (PEN), polybutylene terephthalate (PBT) and polycyclohexane dimethanol terephthalate (PCT); substrates made of polycarbonates; substrates made of fluorine-containing materials such as polyvinyl fluoride (PVF), polyvinylidene fluoride (PVDF), polychlorotrifluoroethylene (PCTFE), polyethylene tetrafluoroethylene (ETFE), polytetrafluoroethylene (PTFE), a tetrafluoroethylene perfluoroalkyl vinyl ether copolymer (PFA), and a tetrafluoroethylene-hexafluoropropylene copolymer (FEP); and substrates made of acrylic resin.

The substrate used in the present invention is not limited to these, and polyolefin resin, polyamide resin, polyarylate resin, etc. can be suitably chosen in consideration of heat resistance, strength properties, electric insulation, etc.

The polyester substrate is a substrate which is produced by polybasic acid or ester derivatives thereof and polyol or ester derivatives thereof.

Examples of the polybasic acid include terephthalic acid, isophthalic acid, phthalic acid, phthalic anhydride, 2,6-naphthalene dicarboxylic acid, 1,4-cyclohexane dicarboxylic acid, adipic acid, sebacic acid, trimellitic acid, pyromellitic acid, dimer acid, maleic acid, and itaconic acid. In the present invention, two or more kinds of the polybasic acid are used.

Examples of the polyol include ethylene glycol, 1,4-butanediol, diethylene glycol, dipropylene glycol, 1,6-hexanediol, 1,4-cyclohexane dimethanol, trimethylolpropane, pentaerythritol, xylene glycol, dimethylolpropane, poly(ethylene oxide) glycol, poly(tetramethylene oxide) glycol, and polyols having a carboxylic acid group, a sulfonic acid group, an amino group, and a salt thereof. The polyol can be used alone or in combination.

Polyester constituting the substrate is generally polyethylene terephthalate (PET), polyethylene naphthalate (PEN), polybutylene terephthalate (PBT), and polycyclohexane dimethanol terephthalate (PCT).

However, the substrate made of polyester, and in particular, the substrate including polyethylene terephthalate, has an ester bond, similarly to the polyurethane-based adhesive. Therefore, there is fear for hydrolysis.

Consequently, when a polyester substrate such as polyethylene terephthalate is used, it is preferable that the polyester be polyester having hydrolysis resistance with a number average molecular weight in a range from 18,000 to 40,000, a content of a cyclic oligomer of 1.5% by weight or less, and an intrinsic viscosity of 0.5 dl/g or more.

In addition, when polyester has a carboxylic acid group at ends thereof, the polyester easily reacts by heat, water, and acid, and easily hydrolyzes. Therefore, it is preferable to produce polyester for the substrate by a solid phase polymerization method which can increase the number average molecular weight without increasing the amount of a carboxylic acid group at ends of the molecule. This is similar to the polyol A.

Furthermore, it is also possible to block the carboxylic acid group at the ends with the carbodiimide compound, epoxy compound, or oxazoline compound, similarly to the polyol A.

When shrinkage due to heat generated in producing a solar cell module is concerned, it is preferable to adjust heat shrinkage percentage of the substrate made of polyester to 1% or less, and preferably 0.5% or less by annealing.

When weather resistance is required, it is possible to add an ultraviolet ray absorber such as benzophenone, benzotriazol, and triazine; an antioxidant such as a hindered phenol antioxidant, a phosphorous antioxidant, a sulfur antioxidant, and a tocopherol antioxidant; or a light stabilizer such as a hindered amine light stabilizer, if necessary.

The polyester substrate used as a sheet for sealing a rear surface of a solar cell may be transparent, and it is preferable to use a white polyester film, because it improves power generation efficiency of a solar cell. In particular, when the sheet for sealing a rear surface of a solar cell is multilayered, it is preferable that at least a substrate attached with a filler be a white polyester film.

Examples of the white polyester film include a pigment dispersing type film which is obtained by adding a white additive such as titanium oxide, silica, alumina, calcium carbonate, and barium sulfate, and a fine foaming type film which is whitened by adding a polymer or fine particles which is not compatible with polyester, and forming voids at the blending interface when the film is biaxially oriented. Among the fine foaming type films, the film using polymer which is not compatible with polyester is preferable. The polymer which is not compatible with polyester is preferably polyolefin resin such as polyethylene, polypropylene, polybutene, and polymethylpentene.

Furthermore, it is also possible to use polyalkylene glycol and copolymer thereof as a compatibilizer, if necessary.

The fine particles may be organic particles or inorganic particles. Examples of the organic fine particles include silicon particles, polyimide particles, crosslinked styrene-divinylbenzene-copolymer particles, crosslinked polyester particles, and fluorine containing particles. Examples of the inorganic fine particles include calcium carbonate, silicon dioxide, and barium sulfate.

Figure 2:
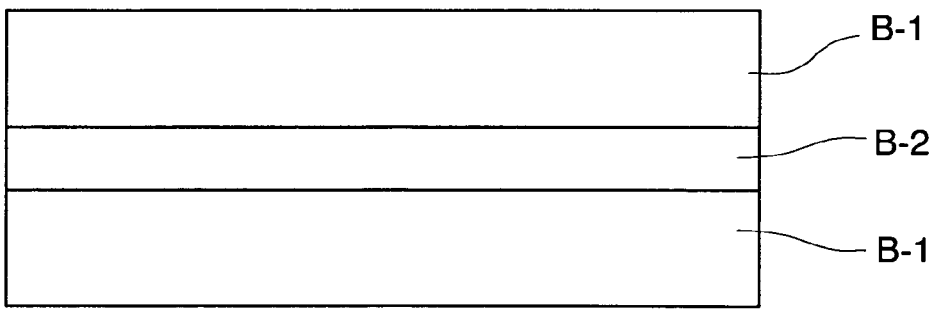
FIG. 2 is a cross-sectional view showing one example of the sheet for sealing a rear surface of a solar cell.

FIG. 2 shows the structure in which the substrates are adhered with the polyurethane-based adhesive comprising the polyols A to E. The structure shown in FIG. 2 is the simplest, and it is obtained by attaching two substrates B-1 and B-1 with the polyurethane-based adhesive B-2.

Figure 3:
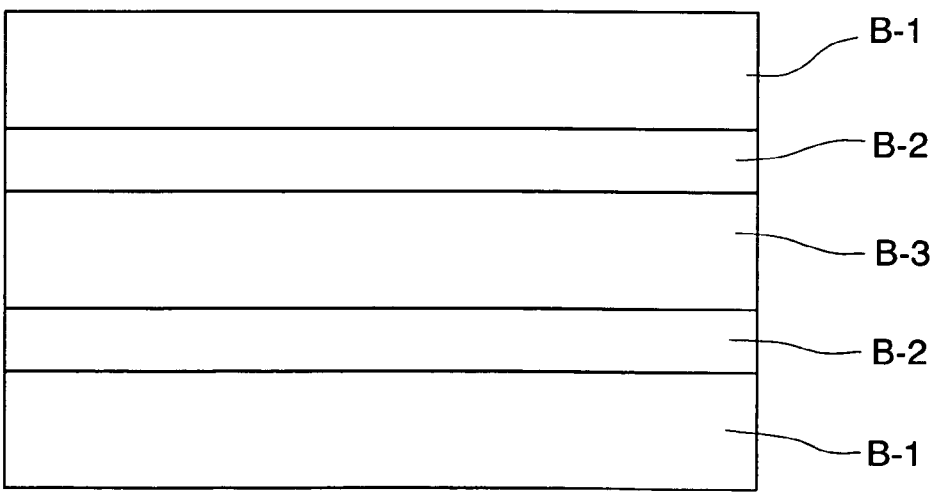
FIG. 3 is a cross-sectional view showing another example of the sheet for sealing a rear surface of a solar cell which includes a barrier layer.

However, it is necessary to interpose a gas barrier layer B-3 for moisture and oxygen in order to practically use it as a sheet for sealing a rear surface of a solar cell. Therefore, the structure of the sheet for sealing a rear surface of a solar cell is finally shown in FIG. 3.

Examples of the gas barrier layer B-3 include a metal foil substrate, a metal evaporated film substrate, an aluminum foil substrate, and an inorganic compound evaporated film substrate.

Examples of the metal foil include an aluminum foil.

Examples of the metal evaporated film substrate typically include an aluminum evaporated film which is obtained by evaporating aluminum on a polyester stretched film, or a polyolefin stretched film.

Examples of the film evaporated with an inorganic compound include a polyester film evaporated with aluminum oxide, silicon oxide, tin oxide, magnesium oxide, indium oxide, or these multiple oxides. As long as a film is transparent, and has bas barrier properties to oxygen, moisture vapor, etc. the film can be used as the gas barrier layer B-3. However, in particular, a polyester film substrate evaporated with aluminum oxide or a polyester film evaporated with silicon oxide is preferably used as the gas barrier layer B-3.

The optimum thickness of the gas barrier layer B-3 varies depending on the kind and composition of the inorganic oxide used. However, in general, the thickness is preferably in a range from 5 to 300 nm, and it is selected in the range depending on any conditions. When the thickness is less than 5 nm or less, a barrier layer having a uniform thickness cannot be obtained, and it is not sufficient to express barrier functions. In contrast, when it exceeds 300 nm, flexibility of the layer is inferior, and cracks may be easily generated by outside stress. The more preferable range of the thickness is in a range from 10 to 150 nm.

The evaporated layer can be produced by a general vacuum evaporation method. Of course, other film forming methods, such as a sputtering method, ion-plating method, Chemical vapor deposition (CVD) using a plasma can also be used.

In addition, when further improvement of gas barrier properties is required, it is also possible to form an overcoat layer containing ethylene-vinyl acetate copolymer which is partially or fully saponified and a silane compound on the evaporated layer containing an inorganic compound.

Various examples of the substrate for the gas barrier layer B-4 are explained. When electrical insulating properties are concerned, a substrate deposited with an inorganic compound is preferable.

When the gas barrier layer B-3 is used in the sheet for sealing a rear surface of a solar cell, hydrolysis resistance of the gas barrier layer B-3 should also be improved. When hydrolysis resistance is concerned, the gas barrier layer B-3 is, in particular, a polyester film evaporated with an inorganic compound is preferable. Among these, a film, on which an inorganic compound is deposited and which includes a polyethylene terephthalate film having a thickness in a range from about 10 to 150 μM as a substrate, is more preferable.

The polyethylene terephthalate having the thickness in the range can be produced by forming a film using a polyester resin melted by a T-die casting method, biaxially orienting at the same time with or after the formation of the film, then thermally fixing. In order to improve workability, it is preferable to use polyester resin having intrinsic viscosity in a range from 0.2 to 0.5 dl/g.

However, even when the hydrolysis resistance of the substrate B-1 or the polyurethane-based adhesive B-2 is improved, and a polyester film is used as the substrate for the evaporated film with an inorganic compound which is the gas barrier layer B-3, since polyester has inferior hydrolysis resistance, as explained above, the bas barrier layer B-3 may be hydrolyzed.

This problem is solved in the present invention as explained below.

(1) A carbodiimide compound, for example, which prevents hydrolysis, is added to the urethane-based adhesive which does not contain a base compound (the polyol A) having hydrolyzability, and contains polyol having excellent hydrolysis resistance, such as the polyols B and C.

The carbodiimide compound, for example, added prevents hydrolysis of the gas barrier layer B-3 rather than hydrolysis of the adhesive.

That is, moisture passes through the polyurethane-based adhesive containing the polyol B and/or the polyol C, and reaches the gas barrier layer B-3. In general, the moisture causes hydrolysis in the gas barrier layer B-3. However, since the carbodiimide compound, for example, is added in the adhesive layer, hydrolysis is prevented in the gas barrier layer B-3 in the present invention.

(2) Next, when an adhesive contains a base compound (the polyol B and/or the polyol C) having hydrolysis resistance and a base compound (the polyol A) having hydrolyzablility, similarly to the polyols D and E, the base compound having hydrolizability consumes moisture, which hydrolyzes the substrate of the gas barrier layer B-3, by being hydrolyzed itself. However, the adhesive also contains the base compound having hydrolysis resistance, the adhesive can maintain functions as the adhesive B-2, and the gas barrier layer B-3 can also maintain functions thereof.

In this case, when the carbodiimide compound is further added, the carbodiimide added prevents hydrolysis of an ester bond due to a carboxyl group generated by hydrolysis of an ester bond in the polyol A. Therefore, it is possible to maintain the functions as the adhesive B-2 at a high level while maintaining the functions of the gas barrier layer B-3.

(3) Finally, in a case of a sheet containing the polyurethane-based adhesive containing the polyol A or the polyol F, which has hydrolyzability, without a base compound having hydrolysis resistance, the functions of the gas barrier layer B-3 are considered more important than the functions of the adhesive layer B-2. In other words, the polyol A is sacrificed to catch moisture which hydrolyzes the gas barrier layer B-3.

However, in this case, when the carbodiimide compound is added, the carbodiimide compound added prevents further hydrolysis of an ester bond due to a carboxyl group generated by hydrolysis of an ester bond in the polyol A. Due to this, it is possible to maintain the functions as the adhesive B-2 while maintaining the functions of the gas barrier layer B-3.

As explained above, it is possible to apply adhesive functions and hydrolysis resistance needed for a sheet for sealing a rear surface of a solar cell by clearly dividing functions to the additives added in the polyurethane-based adhesive compound.

The sheet for sealing a rear surface of a solar cell can be produced by coating the polyurethane-based adhesive such that the dried solid content be in a range from 0.1 to 10 g/m$^2$ by a gravure coating, roll coating, bar coating, reverse coating, etc. on the substrate, and laminating by a dry laminating, etc. The production methods for the sheet for sealing a rear surface of a solar cell are not limited to the production methods. For example, an easily adhesive coating layer containing polyester, polyurethane, acrylic resin, or the mixture thereof can also be formed on the substrate.

When the easily adhesive coating layer is formed, it is preferable to subject the surface of the substrate to a corona treatment, flame treatment, plasma treatment, etc. in order to improve adhesiveness. In particular, the substrate includes a fluorine-based resin, a plasma treatment is preferable.

Figure 4:
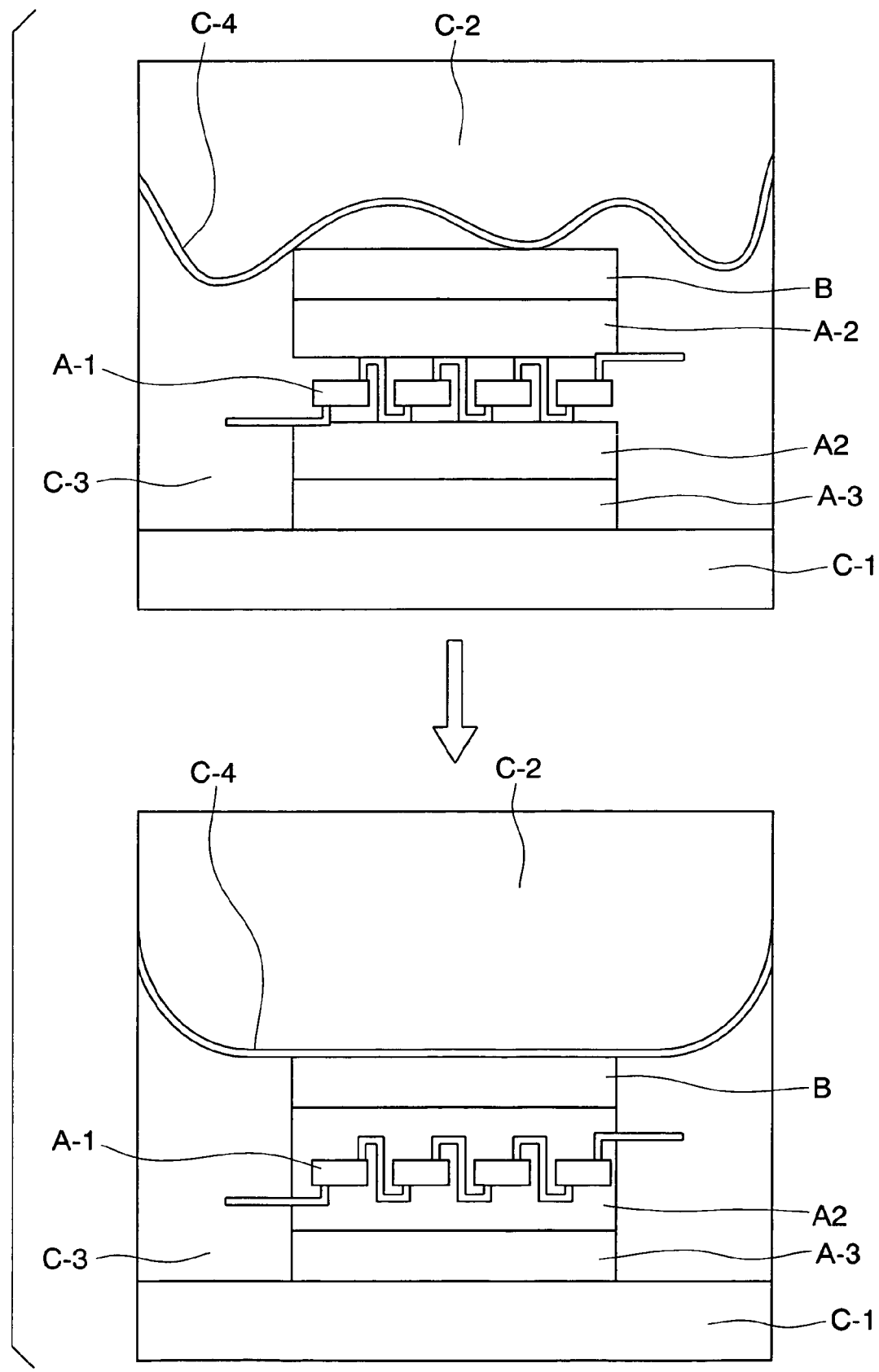
FIG. 4 is a view explaining one example of the steps for producing the solar cell module.

The solar cell module is produced using the laminate as the sheet for sealing a rear surface of a solar cell module. The production method includes the following steps (1) to (4), and is explained referring to FIG. 4.

(1) A glass plate A-3, a filler A-2, cells A-1, and a filler A-2, and the sheet B for sealing a rear surface of a solar cell are set on a top board C-1 heated (at about 120 to 160° C.).
(2) Chambers C-1 and C-2 are vacuumed.
(3) The chamber C-1 is opened and a rubber sheet C-4 having heat resistance is closely contacted with the module.
(4) The filler A-2, which is an ethylene-vinyl acetate copolymer, is melted by heat and pressure generated in the previous step, and thereby the cells A-1 are embedded. In addition, the glass plate A-3, the cell A-1, and the sheet B for sealing a rear surface are adhered, and then the filler A-2 is crosslinked to be solidified.

The step (4) can be performed by two methods. One of them is performed by crosslinking the filler A-2 in an oven in individual line after lamination. The other is performed by crosslinking the filler A-2 in the inside of the laminator. The former is called standard cure. The latter is called fast cure. In general, an ethylene-vinyl acetate copolymer containing vinyl acetate in a range from 10 to 40% by weight is preferably used as the filler for a solar cell module. In order to maintain heat resistance, and physical strength of the solar cell, the ethylene-vinyl acetate copolymer is crosslinked by heat, light, etc.

When the ethylene-vinyl acetate copolymer is crosslinked by heat, an organic peroxide which is decomposed and generates a radical at temperatures of 70° C. or greater. Among the organic peroxides, a crosslinking agent of which the half-life is about 10 hours, and a decomposition temperature of 50° C. or greater is used. Examples of the crosslinking agent include 2,5-dimethylhexane-2,5-dihydroxy peroxide, 2,5-dimethyl-2,5-di(t-butyl peroxy)hexyne-3, di-t-butyl peroxide, t-butyl cumyl peroxide, 2,5-dimethyl-2,5-di(t-butyl peroxy)hexane, dicumyl peroxide, α,α'-bis(t-butyl peroxyisopropyl)benzene, n-butyl-4,4-bis-(t-butyl peroxy) valerate, t-butyl peroxybenzoate, and benzoyl peroxide.

When the ethylene-vinyl acetate copolymer is cured by light, a photosensitizer is used. Preferable examples of a hydrogen abstraction type photosensitizer (bimolecular reaction type photosensitizer) include benzophenone, orthobenzoyl methylbenzoate, 4-benzoyl-4'-methyldiphenyl sulfide, and isopropyl thioxanthone.

Examples of an internal cleavage type initiator include benzoinether, and benzyl dimethyl ketal. In addition, preferable examples of an α-hydroxyalkylphenon type initiator include 2-hydroxy-2-methyl-1-phenylpropan-1-one, 1-hydroxycyclohexylphenyl ketone, alkyl phenyl glyoxylate, and diethoxyacetophenone. Furthermore, preferable example of an α-aminoalkyl phenon type initiator include 2-methyl-1-[4 (methylthio) phenyl]-2-morpholinopropane-1,2-benzyl-2-dimethylamino-1-(4-morpholinophenyl)-butanon e-1. Acylphosphine oxide is also used.

When adhesion to a glass plate constituting a solar cell module is concerned, the urethane-based adhesive preferably contains a silane coupling agent.

Examples of the silane coupling agent include vinyltriethoxysilane, vinyltris(β-methoxyethoxy)silane, γ-methacryloxypropyl trimethoxy silane, vinyltriacetoxysilane, γ-glycidoxypropyl trimetoxysilane, γ-glycidoxy propyl triethoxysilane, β-(3,4-epoxycyclohexyl)ethyltrimethoxysilane, γ-chloropropyl methoxysilane, vinyl trichlorosilane, γ-mercaptopropyl trimethoxysilane, γ-aminopropyl triethoxysilane, and N-β(aminoethyl)-γ-aminopropyl trimethoxysilane.

In order to promote adhesive and hardening, it is preferable to add a compound having an epoxy group. Preferable examples of the compound having an epoxy group include triglycidyl tris (2-hydroxyethyl)isocyanurate, neopentyl glycol diglycidyl ether, 1,6-hexanediol diglycidyl ether, acrylic glycidyl ether, 2-ethylhexyl glycidyl ether, phenyl glycidyl ether, phenol glycidyl ether, p-t-buthylphenyl glycidyl ether, adipic acid diglycidyl ester, o-phthalic acid diglycidyl ester, glycidyl methacrylate, and butylglycidyl diether. In addition, an oligomer having an epoxy group and a molecular weight in a range from several hundred to several thousand, and a polymer having an epoxy group and a molecular weight in a range from several thousand to hundreds of thousand are also be preferable.

In addition, in order to improve crosslinking properties, adhesion, mechanical strength, heat resistance, moisture resistance, weather resistance, etc. of the filler, it is also preferable to add a compound having an acryloxy group, methacryloxy group, or allyl group. (Meth)acrylic acid derivatives, for example, an alkyl ester or an amide thereof is preferable. Examples of the alkyl group include a cyclohexyl group, tetrahydrofurfuryl group, aminoethyl group, 2-hydroxyethyl group, 3-hydroxypropyl group, and 3-chloro-2- hydroxypropyl group, in addition to an alkyl group such as a methyl, ethyl, dodecyl, stearyl, lauryl group.

In addition, esters between (meth)acrylic acid and polyfunctional alcohol such as ethylene glycol, triethylene glycol, polyethylene glycol, glycerin, trimethylolpropane, pentaerythritol, etc.

Typical amide is an acrylamide. Preferable examples of the compound having an allyl group include triaryl cyanurate, triallyl isocyanurate, diallyl phthalate, diallyl isophthalate, and diaryl maleate.

Furthermore, it is also preferable to add an inorganic compound to provide fire retardancy, an ultraviolet ray absorbent to provide weather resistance, and various antioxidants to prevent oxidation degradation.

In other words, various additives may be added to the ethylene-vinyl acetate copolymer to fulfill functions required as a solar cell module.

Therefore, in order to raise the adhesion between the filler containing the ethylene-vinyl acetate copolymer and various additives, and the sheet for sealing a rear surface of a solar cell, it is preferable to form an adhesive coating layer, which contains an acrylic resin, epoxy resin, phenol resin, polyester resin, urethane resin, styrene resin, or modified compound thereof on a surface of the substrate B-1 at which the filler contacts.

According to the present invention, it is possible to provide the sheet for sealing a rear surface of a solar cell which have excellent hydrolysis resistance and sufficiently protects the solar cell module.

In addition, since the solar cell module includes the sheet for sealing a rear surface of a solar cell having the excellent properties, the solar cell module can maintain excellent electric output properties for a long period of time.

EXAMPLE

Below, examples of the present invention are explained. However, the present invention is not limited to the following examples.

First, material for producing the sheet for sealing a rear surface of a solar cell is explained.

As the substrate for the sheet for sealing a rear surface of a solar cell, the following substrate 1 and 2 were used. Moreover, the substrate 3 was used as the substrate for the gas barrier layer.

<Substrate 1>

A "fine foaming type" white polyethylene terephthalate film having a thickness of 188 μm was used. The polyethylene terephthalate has an an oligomer content of 0.5% by weight, a number average molecular weight of 19,500, and an intrinsic viscosity of 0.7 dl/g. The substrate 1 is a two-kind three-layer type multilayer film which includes a fine forming layer as an intermediate layer. The percentage of the thickness of the intermediate layer relative to the entire thickness of the film is 80%. The surface at which contacted the adhesive of the white polyethyelene terephthalate film was not subjected to any treatments.

<Substrate 2>

A two-kind two-layer type multilayer film including polyvinylidene fluoride (PVDF) resin and having a thickness of 40 μm was used. The film is made of a polymer alloy containing PVDF and an acrylic resin. One layer is made of a mixture of PVDF and acrylic resin at 80/20 (PVDF/acrylic resin), and the other layer is made of a mixture of PVDF and acrylic resin at 20/80 (PVDF/acrylic). A surface of the layer comprising PVDF and an acrylic resin at 20/80 was made into the lamination side of adhesives, and a plasma treatment was performed to this surface in advance.

<Substrate 3>

An alumina deposition layer having a thickness of 20 nm was formed by a PVD method on a common polyethylene terephthalate film which is biaxially oriented and has a thickness of 12 nm. Then, a coating layer having a thickness of 0.5 μm was formed on the alumina deposition layer by sol-gel reacting an ethylene-vinyl acetate copolymer, which was fully saponified, with a hydrolysate of alkoxysilane. The obtained substrate was used as a gas barrier substrate.

The following adhesive 1 to 8 was used to laminate the substrates.

<Adhesive 1>

A polyurethane-based adhesive (adhesive 1) was obtained by adding a curing agent which is a mixture of xylylene diisocyanate (an adduct) and hexamethylene diisocyanate (a burret) to polyester polyol as a base compound at a solid content ratio of 1:3.

<Adhesive 2>

A polyurethane-based adhesive (adhesive 2) was obtained by adding 10 parts by weight of N,N'-diphenyl carbodiimide to 100 parts by weight of the adhesive 1.

<Adhesive 3>

A polyurethane-based adhesive (adhesive 3) was obtained by adding a curing agent which includes isophorone diisocyanate (a trimer) to aliphatic polycarbonate of which a chain was elongated with isophorone diisocyanate (a monomer) at a solid content ratio of 1:3.

<Adhesive 4>

A polyurethane-based adhesive (adhesive 4) was obtained by adding 30 parts by weight of N,N'-diphenyl carbodiimide to 100 parts by weight of the adhesive 3.

<Adhesive 5>

A polyurethane-based adhesive (adhesive 5) was obtained by adding a curing agent which includes hexamethylene diisocyanate (a burret) to acrylic polyol, which is copolymerized with hycroxyethyl methacrylate in its skelton, as a base compound at a solid content ratio of 1:3.

<Adhesive 6>

First, a base mixture was obtained by blending aliphatic polycarbonate, of which a chain was elongated with isophorone diisocyanate (a monomer), and polyester polyol at 70/30. Then, a polyurethane-based adhesive was obtained by adding a curing agent which includes isophorone diisocyanate (a trimer) to the base mixture. After that, a polyurethane-based adhesive (adhesive 6) was obtained by adding 30 parts by weight of N,N'-diphenyl carbodiimide to 100 parts by weight of the obtained polyurethane-based adhesive.

<Adhesives 7>

First, a polyurethane-based adhesive was obtained by adding a curing agent which includes xylylene diisocyanate to polyether polyol as a base component at a solid content ratio of 1:4. Then, a polyurethane-based adhesive (adhesive 7) was obtained by adding 30 parts by weight of N,N'-diphenyl carbodiimide to 100 parts by weight of the obtained polyurethane-based adhesive.

<Adhesives 8>

First, a copolymerization type base compound was obtained by blending aliphatic polycarbonate to polyester polyol at 70:30, and adding isophorone diisocyanate (a monomer) to elongate the chain of the obtained copolymer. Then, a polyurethane-based adhesive was obtained by adding a curing agent which includes isophorone diisocyanate (a trimer) to the obtained base compound at a solid component ratio of 3:1 (base compound: curing agent). After that, a polyurethane-based adhesive (adhesive 8) was obtained by adding 30 parts by weight of N,N'-diphenyl carbodiimide to 100 parts by weight of the obtained polyurethane-based adhesive.

Production of a Sheet for Sealing a Rear Surface of a Solar Cell

The substrate 1 to 3 was layered using the adhesive 1 to 8. The amount of the adhesive coated was adjusted such that the coated amount dried was 5 g/m$^2$. The obtained products were aged at 50° C. for five days. The obtained samples have the following structure 1 to 4.

Structure 1: substrate 1/adhesive/substrate 1
Structure 2: substrate 2/adhesive/substrate 2
Structure 3: substrate 1/adhesive/substrate 3/(adhesive)/substrate 1
Structure 4: substrate 2/adhesive/substrate 3/(adhesive)/substrate 2

"(Adhesive)" in Structures 3 and 4 means that (adhesive) contacts the evaporated layer of the substrate 3.

Methods for Evaluating the Obtained Samples

The obtained sheets for sealing a rear surface of a solar cell were evaluated by an acceleration test under pressurized steam conditions.

The obtained sample was cut off in A4 size, and it was set in a HAST chamber (acceleration evaluation device under pressurized and moisture conditions). After that, lamination strength and peeling situation with age at 105° C. and 1.05 atm were evaluated. Lamination strength at crosshead speed of 300 mm/min. in 15 mm-width was measured by a T-type peeling method using a Tensile tester. A sheet for sealing a rear surface of a solar cell is required to be stored for 2,000 hours or longer at 85° C.-85% RH in a case of a common acceleration evaluation. However, evaluation time could be shortened by using the evaluation method. Moreover, it is already confirmed that physical values after 2,000 hours at 85° C.-85% RH correspond to physical values after 168 hours at 105° C., 1.05 atom.

The basic performance of the adhesive using the obtained samples was examined in accordance with the evaluation method. The results are shown in Tables 1 to 3.

Example 1

The samples having the structure 1 to 4 were produced using the adhesive 1.

Example 2

The samples having the structure 1 to 4 were produced using the adhesive 2.

Example 3

The samples having the structure 1 to 4 were produced using the adhesive 3.

Example 4

The samples having the structure 1 to 4 were produced using the adhesive 4.

Example 5

The samples having the structure 1 to 4 were produced using the adhesive 5.

Example 6

The samples having the structure 1 to 4 were produced using the adhesive 6.

Example 7

The samples having the structure 1 to 4 were produced using the adhesive 7.

Example 8

The samples having the structure 1 to 4 were produced using the adhesive 8.

TABLE 1

| | | | Lamination strength (N/15 mm) | | | | | |
|---|---|---|---|---|---|---|---|---|
| | | | | Acceleration test(105° C.) | | | | |
| Adhesive No. | Structure No. | Initial | 96 h | 144 h | 168 h | 192 h | 216 h | Evaluation |
| Example 1  1 | 1 | 4.2 interface | 4.3 interface | 2.2 cohesion | 0.7 cohesion | 0.3 cohesion and raised surface | 0.3 cohesion and raised surface | Bad |
| | 2 | 3.8 interface | 3.7 interface | 1.9 cohesion | 0.4 Cohesion and raised surface | 0.3 cohesion and raised surface | 0.3 cohesion and raised surface | Bad |
| | 3 | 4.2 interface | 4.1 interface | 1.9 cohesion | 0.9 cohesion and raised surface | 0.3 cohesion and raised surface | 0.3 cohesion and raised surface | Bad |
| | | 3.9 interface | 2.2 cohesion | * | * | * | * | |
| | 4 | 4.2 interface | 4.3 interface | 1.9 cohesion | 0.5 cohesion and raised surface | 0.3 cohesion and raised surface | 0.3 cohesion and raised surface | Bad |
| | | 4.1 interface | 2 cohesion | * | * | * | * | |
| Example 2  2 | 1 | 3.8 interface | 4.1 interface | 3.9 cohesion | 3.9 cohesion | 2.2 cohesion | 1.5 cohesion | Good |
| | 2 | 3.6 interface | 3.7 interface | 3.5 cohesion | 2.9 cohesion | 2.1 cohesion | 1.4 cohesion | Good |
| | 3 | 3.7 interface | 4.1 interface | 3.8 cohesion | 3.9 cohesion | 2.4 cohesion | 1.8 cohesion | Good |

TABLE 1-continued

| Adhesive No. | Structure No. | Lamination strength (N/15 mm) | | | | | | Evaluation |
|---|---|---|---|---|---|---|---|---|
| | | Initial | Acceleration test(105° C.) | | | | | |
| | | | 96 h | 144 h | 168 h | 192 h | 216 h | |
| | | 3.6 interface | 3.2 cohesion | 2.6 cohesion | 2.1 cohesion | 1.6 cohesion | 1.3 cohesion | |
| | 4 | 3.5 interface | 4.4 interface | 3.9 cohesion | 3.8 cohesion | 2.2 cohesion | 1.9 cohesion | Good |
| | | 3.7 interface | 3.4 cohesion | 2.8 cohesion | 2.2 cohesion | 1.4 cohesion | 1.2 cohesion | |
| Example 3  3 | 1 | 3.6 interface | 3.8 interface | 3.6 interface | 3.2 interface | 3.5 interface | 3.2 interface | Good |
| | 2 | 3.3 interface | 3.4 interface | 3.2 interface | 2.9 interface | 2.8 interface | 2.6 interface | Good |
| | 3 | 3.7 interface | * | * | * | * | * | Bad |
| | | 3.2 interface | * | * | * | * | * | |
| | 4 | 3.1 interface | * | * | * | * | * | Bad |
| | | 3.1 interface | * | * | * | * | * | |

In Table, "*" means that incapable measurement due to damage of the substrate 3.

TABLE 2

| Adhesive No. | Structure No. | Lamination strength (N/15 mm) | | | | | | Evaluation |
|---|---|---|---|---|---|---|---|---|
| | | Initial | Acceleration test(105° C.) | | | | | |
| | | | 96 h | 144 h | 168 h | 192 h | 216 h | |
| Example 4  4 | 1 | 4.8 interface | 4.2 interface | 3.9 interface | 3.6 interface | 3.2 interface | 3.1 interface | Good |
| | 2 | 4.9 interface | 4.4 interface | 4.2 interface | 3.9 interface | 3.3 interface | 2.9 interface | Good |
| | 3 | 4.3 interface | 3.7 interface | 3.2 interface | 2.9 interface | 2.8 interface | 2.6 interface | Good |
| | | 4.2 interface | 3.8 interface | 3.2 interface | 2.7 interface | 2.4 interface | 2.2 interface | |
| | 4 | 4.6 interface | 4.1 interface | 3.5 interface | 3.1 interface | 2.8 interface | 2.6 interface | Good |
| | | 4.4 interface | 4.1 interface | 3.8 interface | 3.6 interface | 3.2 interface | 2.8 interface | |
| Example 5  5 | 1 | 3.2 interface | 2.9 interface | 2.8 interface | 3.1 interface | 2.9 interface | 2.5 interface | Good |
| | 2 | 2.9 interface | 2.7 interface | 2.2 interface | 1.9 nterface | 1.8 interface | 1.6 interface | Good |
| | 3 | 3.7 interface | * | * | * | * | * | Bad |
| | | 3.2 interface | * | * | * | * | * | |
| | 4 | 2.8 interface | * | * | * | * | * | Bad |
| | | 2.6 interface | * | * | * | * | * | |
| Example 6  6 | 1 | 4.2 interface | 4.1 interface | 3.9 interface | 3.9 interface | 3.5 interface | 3.4 interface | Good |
| | 2 | 4.9 interface | 4.6 interface | 4.3 interface | 3.9 interface | 3.5 interface | 2.9 interface | Good |
| | 3 | 4.2 interface | 3.6 interface | 3.2 interface | 2.8 interface | 2.4 interface | 2.3 interface | Good |
| | | 4.4 interface | 3.9 interface | 3.4 interface | 2.9 interface | 2.4 interface | 2.3 interface | |
| | 4 | 4.6 interface | 4.3 interface | 3.5 interface | 3.1 interface | 2.6 interface | 2.4 interface | Good |
| | | 4.5 interface | 4.4 interface | 3.8 interface | 3.2 interface | 2.5 interface | 2.2 interface | |

In Table, "*" means that incapable measurement due to damage of the substrate 3.

TABLE 3

| Adhesive No. | Structure No. | Lamination strength (N/15 mm) | | | | | | Evaluation |
|---|---|---|---|---|---|---|---|---|
| | | Initial | Acceleration test(105° C.) | | | | | |
| | | | 96 h | 144 h | 168 h | 192 h | 216 h | |
| Example 7  7 | 1 | 3.5 interface | 3.7 interface | 3.5 interface | 3.3 interface | 3.2 interface | 2.8 interface | Good |
| | 2 | 3.8 interface | 3.6 interface | 3.5 interface | 3.4 interface | 3.2 interface | 3 interface | Good |
| | 3 | 3.6 interface | 3.6 interface | 3.8 interface | 3.5 interface | 3.3 interface | 3.2 interface | Good |
| | | 3.5 interface | 3.6 interface | 3.8 interface | 3.5 interface | 3.3 interface | 3.2 interface | |
| | 4 | 3.8 interface | 3.9 interface | 4 interface | 3.7 interface | 3.6 interface | 3 interface | Good |
| | | 3.9 interface | 3.6 cohesion | 3.8 interface | 3.5 interface | 3.5 interface | 3.3 interface | |
| Example 8  8 | 1 | 4.6 interface | 4.4 interface | 3.8 interface | 3.1 interface | 2.9 interface | 2.6 interface | Good |
| | 2 | 4.5 interface | 4.2 interface | 4.1 interface | 3.6 interface | 3.2 interface | 2.9 interface | Good |
| | 3 | 4.4 interface | 3.8 interface | 3.2 interface | 2.8 interface | 2.6 interface | 2.4 interface | Good |
| | | 4.4 interface | 3.5 interface | 2.9 interface | 2.6 interface | 2.2 interface | 1.9 interface | |
| | 4 | 4.3 interface | 4.1 interface | 3.8 interface | 3.4 interface | 2.6 interface | 2.4 interface | Good |
| | | 4.7 interface | 4.1 interface | 3.8 interface | 3.4 interface | 2.9 interface | 2.4 interface | |

In Table, "*" means that incapable measurement due to damage of the substrate 3.

From Tables 1 to 3, it was confirmed that the lamination strength in the sheet having the structures 1 or 2, which contains polyester polyol-based polyurethane resin and does not contain carbodiimide, decreased in the acceleration test of 168 hours or longer, and blister caused by delamination was visually observed. In addition, it was confirmed that adding carbodiimide maintains cohesion and improves hydrolysis resistance. Furthermore, it was also confirmed that the sheet made by using polycarbonate resin, acrylic resin, etc. did not affect much influences by hydrolysis, and maintained high lamination strength with age without carbodiimide.

In contrast, in the case of the sheet, which has the structure 3 or 4 including the common polyester film oriented biaxially as the intermediate layer, when the sheet was made by using polycarbonate or acrylic resin without carbodiimide as a main compound, there is a trend that the sheet could not be practically used as a sheet for sealing a rear surface of a solar cell due to hydrolysis in the polyester substrate which is the intermediate layer. However, hydrolysis in not only in adhesive but also in the polyester layer as the intermediate layer could be prevented by adding carbodiimide.

As explained above, in the sheet for sealing a rear surface of a solar cell it is possible to prevent degradation due to hydrolysis of the material constituting the solar cell and appearance defects due to delamination not only under conditions for actual usage of the solar cell module but also conditions for evaluation under high temperatures and high moistures, in addition to maintain excellent barrier properties and electric output properties.

INDUSTRIAL APPLICABILITY

The present invention provides a sheet for sealing a rear surface of a solar cell in which degradation due to hydrolysis of the material constituting the solar cell is prevented, and the weather resistance is excellent such that electric output properties of the solar cell can be maintained not only under conditions for actual usage of the solar cell module but also conditions for evaluation under high temperatures and high moistures.

The invention claimed is:

1. A sheet for sealing a rear surface of a solar cell comprising:
    a laminate in which at least two substrates are attached by an polyurethane-based adhesive, the polyurethane-based adhesive comprising an adhesive having hydrolysis resistance which satisfies the following conditions:
    condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
    condition 2: the adhesive does not bring on a delamination and a blister between the substrates after keeping the laminate in a chamber which acts as a highly accelerated stress test system under pressurized steam conditions of 105° C. and 1.05 atm for 168 hours,
    the polyurethane-based adhesive being an adhesive composition comprising 1 to 50 parts by weight of at least one compound selected from the group consisting of a carbodiimide compound, an oxazoline compound, and an epoxy compound, relative to 100 parts by weight of a composition comprising polyol A and a crosslinking agent, and
    the polyol A being at least one of polyester polyol and polyester urethane polyol of which a chain is elongated by an isocyanate compound having two or greater functional groups.

2. A sheet for sealing a rear surface of a solar cell according to claim 1, wherein the crosslinking agent comprise at least one isocyanate compound selected from the group consisting of 2,4-tolylene diisocyanate, 2,6-tolylene diisocyanate, xylylene diisocyanate, 4,4'-diphenylmethane diisocyanate, methylene diisocyanate, isopropylene diisocyanate, lysine diisocyanate, 2,2,4-trimethyihexamethylene diisocyanate, 2,4,4-trimethylhexamethylene diisocyanate, 1,6-hexamethylene diisocyanate, methylcyclohexane diisocyanate, isophorone diisocyanate, 4,4'-dicyclohexylmethane diisocyanate, and isopropylidene cyclohexyl-4,4'-diisocyanate; an adduct, a buret, and an isocyanurate which comprises at least one of the isocyanate compounds.

3. A sheet for sealing a rear surface of a solar cell according to claim 1, wherein the substrate is a substrate made of polyester selected from the group consisting of polyethylene terephthalate (PET), polyethylene naphthalate (PEN), polybutylene terephthalate (PBT), and polycyclohexane dimethanol-terephthalate (PCT); a substrate made of polycarbonate; a substrate made of a fluorine-containing material selected from the group consisting of polyvinyl fluoride (PVF), polyvinylidene fluoride (PVDF), polychlorotrifluoroethylene resin (PCTFE), polyethylene tetrafluoroethylene (ETFE), polytetrafluoroethylene (PTFE), a tetrafluoroethylene perfluoroalkyl vinyl ether copolymer (PFA), and a tetrafluoroethylene-hexafluoropropylene copolymer (FEP); and a substrate made of acrylic resin.

4. A sheet for sealing a rear surface of a solar cell according to claim 1, wherein the substrate is a substrate made of polyester which has an number average molecular weight is in a range from 18,000 to 40,000, a content of a cyclic oligomer is 1.5% by weight or less, an intrinsic viscosity is 0.5 dl/g or greater, and has hydrolysis resistance.

5. A sheet for sealing a rear surface of a solar cell according to claim 1, wherein the laminate further comprises an aluminum foil substrate, an aluminum evaporated substrate, a silica evaporated substrate, or an alumina evaporated substrate.

6. A solar cell module comprising the sheet for sealing a rear surface of a solar cell according to claim 1.

7. A sheet for sealing a rear surface of a solar cell comprising:
a laminate in which at least two substrates are attached by a polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
condition 2: the adhesive does not bring on a delamination and a blister between the substrates after keeping the laminate in a chamber which acts as a highly accelerated stress test system under pressurized steam conditions of 105° C. and 1.05 atm for 168 hours,
the polyurethane-based adhesive being an adhesive composition comprising 1 to 50 parts by weight of at least one compound selected from the group consisting of a carbodiimide compound, an oxazoline compound, and an epoxy compound, relative to 100 parts by weight of polyol B and a crosslinking agent, and
the polyol B being at least one of polycarbonate polyol and polycarbonate urethane polyol of which a chain is elongated by an isocyanate compound having two or greater functional groups.

8. A sheet for sealing a rear surface of a solar cell according to claim 7, wherein
the polyurethane-based adhesive is an adhesive composition comprising 1 to 50 parts by weight of at least one compound selected from the group consisting of a carbodiimide compound, an oxazoline compound, and an epoxy compound, relative to 100 parts by weight of polyol D and a crosslinking agent,
the polyol D comprises 1 to 50% by weight of polyol A, and 50 to 99% by weight of polyol B,
the polyol A is at least one of polyester polyol and polyester urethane polyol of which a chain is elongated by an isocyanate compound having two or greater functional groups, and
the polyol B is at least one of polycarbonate polyol and polycarbonate urethane polyol of which a chain is elongated by an isocyanate compound having two or greater functional groups.

9. A sheet for sealing a rear surface of a solar cell according to claim 8, wherein the polyol D further comprises polyol C such that the total content of the polyol B and the polyol C is 50 to 99% by weight of the polyol D, and the polyol C is acrylpolyol in which a hydroxyl group is introduced into a side chain.

10. A sheet for sealing a rear surface of a solar cell according to claim 7, wherein
the polyurethane-based adhesive is an adhesive composition comprising 1 to 50 parts by weight of at least one compound selected from the group consisting of a carbodiimide compound, an oxazoline compound, and an epoxy compound, relative to 100 parts by weight of polyol E and a crosslinking agent,
the polyol E is a polyol copolymer in which 1 to 50% by weight of polyol A, and 50 to 99% by weight of polyol B is subjected to a chain elongation reaction with an isocyanate compound having two or more functional groups,
the polyol A is at least one of polyester polyol and polyester urethane polyol of which a chain is elongated by an isocyanate compound having two or greater functional groups, and
the polyol B is at least one of polycarbonate polyol and polycarbonate urethane polyol of which a chain is elongated by an isocyanate compound having two or greater functional groups.

11. A sheet for sealing a rear surface of a solar cell according to claim 10, wherein the polyurethane-based adhesive is an adhesive composition comprising 1 to 50 parts by weight of at least one compound selected from the group consisting of a carbodiimide compound, an oxazoline compound, and an epoxy compound, relative to 100 parts by weight of polyol E and a crosslinking agent,
the polyol E is a polyol copolymer in which 1 to 50% by weight of polyol A, and 50 to 99% by weight of polyol B and polyol C is subjected to a chain elongation reaction with an isocyanate compound having two or more functional groups,
the polyol A is at least one of polyester polyol and polyester urethane polyol of which a chain is elongated by an isocyanate compound having two or greater functional groups,
the polyol B is at least one of polycarbonate polyol and polycarbonate urethane polyol of which a chain is elongated by an isocyanate compound having two or greater functional groups, and
the polyol C is acrylpolyol in which a hydroxyl group is introduced into a side chain.

12. A sheet for sealing a rear surface of a solar cell comprising:
a laminate in which at least two substrates are attached by an polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and condition 2: the adhesive does not bring on a delamination and a blister between the substrates after keeping the laminate in a chamber which acts as a highly accelerated stress test system under pressurized steam conditions of 105° C. and 1.05 atm for 168 hours, the polyurethane-based adhesive being an adhesive composition comprising 1 to 50 parts by weight of at least one compound selected from the group consisting of a carbodiimide compound, an oxazoline compound, and an epoxy compound, relative to 100 parts by weight of polyol C and a crosslinking agent, and the polyol C being acrylpolyol in which a hydroxyl group is introduced into a side chain.

13. A sheet for sealing a rear surface of a solar cell according to claim 12, wherein the polyurethane-based adhesive further comprises polyol A, the content of the polyol A is in a range of 1 to 50% by weight and the content of polyol C is in a range of 50 to 99% by weight, and the polyol A is at least one of polyester polyol and polyester urethane polyol of which a chain is elongated by an isocyanate compound having two or greater functional groups.

14. A sheet for sealing a rear surface of a solar cell according to claim 12, wherein
the polyurethane-based adhesive is an adhesive composition comprising 1 to 50 parts by weight of at least one compound selected from the group consisting of a carbodiimide compound, an oxazoline compound, and an epoxy compound, relative to 100 parts by weight of polyol E and a crosslinking agent,
the polyol E is a polyol copolymer in which 1 to 50% by weight of polyol A, and 50 to 99% by weight of polyol C is subjected to a chain elongation reaction with an isocyanate compound having two or more functional groups, and
the polyol A is at least one of polyester polyol and polyester urethane polyol of which a chain is elongated by an isocyanate compound having two or greater functional groups.

15. A sheet for sealing a rear surface of a solar cell comprising:
a laminate in which at least two substrates are attached by a polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
condition 2: the adhesive does not bring on a delamination and a blister between the substrates after keeping the laminate in a chamber which acts as a highly accelerated stress test system under pressurized steam conditions of 105° C. and 1.05 atm for 168 hours,
the polyurethane-based adhesive being an adhesive composition comprising 1 to 50 parts by weight of at least one compound selected from the group consisting of a carbodiimide compound, an oxazoline compound, and an epoxy compound, relative to 100 parts by weight of polyol F and a crosslinking agent, and
the polyol F being at least one of polyether polyol and polyether urethane polyol of which a chain is elongated by an isocyanate compound having two or greater functional groups.

16. A sheet for sealing a rear surface of a solar cell comprising:
a laminate in which at least two substrates are attached by a polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
condition 2: the adhesive does not bring on a delamination and a blister between the substrates after keeping the laminate in a chamber which acts as a highly accelerated stress test system under pressurized steam conditions of 105° C. and 1.05 atm for 168 hours,
the polyurethane-based adhesive being an adhesive composition comprising polyol B and a crosslinking agent, and
the polyol B being at least one of polycarbonate polyol and polycarbonate urethane polyol of which a chain is elongated by an isocyanate compound having two or greater functional groups.

17. A sheet for sealing a rear surface of a solar cell comprising:
a laminate in which at least two substrates are attached by a polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
condition 2: the adhesive does not bring on a delamination and a blister between the substrates after keeping the laminate in a chamber which acts as a highly accelerated stress test system under pressurized steam conditions of 105° C. and 1.05 atm for 168 hours,
the polyurethane-based adhesive being an adhesive composition comprising polyol C and a crosslinking agent, and
the polyol C being acrylpolyol in which a hydroxyl group is introduced into a side chain.

18. A sheet for sealing a rear surface of a solar cell comprising:
a laminate in which at least two substrates are attached by a polyurethane-based adhesive, the polyurethane-based adhesive comprising an adhesive having hydrolysis resistance which satisfies the following conditions:
condition 1: the lamination strength of the adhesive is 1 N/15 mm or more after keeping the laminate in a chamber which acts as a highly accelerated stress test system under pressurized steam conditions of 105° C. and 1.05 atm for 168 hours; and
condition 2: the adhesive does not bring on a delamination and a blister between the substrates after keeping the laminate in a chamber which acts as a highly accelerated stress test system under pressurized steam conditions of 105° C. and 1.05 atm for 168 hours,
the polyurethane-based adhesive being an adhesive composition comprising polyol D and a crosslinking agent,
the polyol D comprising 1 to 50% by weight of polyol A, and 50 to 99% by weight of at least one of polyol B and polyol C, the polyol A being at least one of polyester polyol and polyester urethane polyol of which a chain is elongated by an isocyanate compound having two or greater functional groups, the polyol B being at least one of polycarbonate polyol and polycarbonate urethane polyol of which a chain is elongated by an isocyanate compound having two or greater functional groups, and the polyol C being acrylpolyol in which a hydroxyl group is introduced into a side chain.

19. A sheet for sealing a rear surface of a solar cell comprising:

a laminate in which at least two substrates are attached by an polyurethane-based adhesive, the polyurethane-based adhesive comprising an adhesive having hydrolysis resistance which satisfies the following conditions:

condition 1: the lamination strength of the adhesive is 1 N/15 mm or more after keeping the laminate in a chamber which acts as a highly accelerated stress test system under pressurized steam conditions of 105° C. and 1.05 atm for 168 hours; and condition 2: the adhesive does not bring on a delamination and a blister between the substrates after keeping the laminate in a chamber which acts as a highly accelerated stress test system under pressurized steam conditions of 105° C. and 1.05 atm for 168 hours, the polyurethane-based adhesive being an adhesive composition comprising polyol E and a crosslinking agent, the polyol E being a polyol copolymer in which 1 to 50% by weight of polyol A, and 50 to 99% by weight of at least one of polyol B and polyol C is subjected to a chain elongation reaction with an isocyanate compound having two or more functional groups, the polyol A being at least one of polyester polyol and polyester urethane polyol of which a chain is elongated by an isocyanate compound having two or greater functional groups, the polyol B being at least one of polycarbonate polyol and polycarbonate urethane polyol of which a chain is elongated by an isocyanate compound having two or greater functional groups, and the polyol C is acrylpolyol in which a hydroxyl group is introduced into a side chain.

* * * * *

UNITED STATES PATENT AND TRADEMARK OFFICE
CERTIFICATE OF CORRECTION

PATENT NO. : 8,507,791 B2
APPLICATION NO. : 12/308572
DATED : August 13, 2013
INVENTOR(S) : Masayoshi Suzuta et al.

Page 1 of 1

It is certified that error appears in the above-identified patent and that said Letters Patent is hereby corrected as shown below:

In the Claims

Col. 22, Line 37, In Claim 1, delete "an" and insert -- a --, therefor.

Col. 22, Line 67, In Claim 2, delete "trimethyihexamethylene" and insert -- trimethylhexamethylene --, therefor.

Col. 24, Line 63, In Claim 12, delete "an" and insert -- a --, therefor.

Col. 27, Line 14, In Claim 19, delete "an" and insert -- a --, therefor.

Signed and Sealed this
Twenty-fourth Day of December, 2013

Margaret A. Focarino
*Commissioner for Patents of the United States Patent and Trademark Office*